(12) United States Patent
Sandhu et al.

(10) Patent No.: US 6,201,219 B1
(45) Date of Patent: Mar. 13, 2001

(54) CHAMBER AND CLEANING PROCESS THEREFOR

(75) Inventors: Gurtej S. Sandhu; Ravi T. Iyer; Donald L. Westmoreland, all of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/030,309

(22) Filed: Feb. 25, 1998

(51) Int. Cl.⁷ ........................................................ F27B 5/14
(52) U.S. Cl. ........................... 219/390; 438/905; 134/1.1; 118/724
(58) Field of Search .................................... 219/390, 391, 219/393, 411; 392/416, 418; 118/724, 725, 50.1, 70; 134/1.1, 1.2, 19, 105, 92; 438/905

(56) References Cited

U.S. PATENT DOCUMENTS

| | | | |
|---|---|---|---|
| 5,630,917 | * 5/1997 | Guo | 204/192.12 |
| 5,849,092 | * 12/1998 | Xi et al. | 134/1.1 |
| 5,961,850 | * 10/1999 | Satou et al. | 216/67 |
| 5,972,114 | * 10/1999 | Yonenaga et al. | 118/715 |

\* cited by examiner

Primary Examiner—Teresa Walberg
Assistant Examiner—Shawntina Fuqua
(74) Attorney, Agent, or Firm—Workman, Nydegger & Seeley

(57) ABSTRACT

A modified processing chamber is disclosed and a process for selectively cleaning the processing chamber by applying energy in a temperature pattern to surfaces of the processing chamber which receive deposits as a result of prior operations conducted within the processing chamber. The processing chamber is cleaned by ion bombardment with heat driven plasma cleaning which is selective to the heated portions of the processing chamber. Also disclosed are various embodiments for applying the temperature pattern to surfaces of the processing chamber, including the use of combustion flames or heat lamps which are positioned to heat surfaces which are to be cleaned. Another embodiment comprises the use of heating elements embedded in the surfaces to be cleaned, and yet another embodiment comprises a susceptor which is heated and radiates heat onto the surfaces to be cleaned.

43 Claims, 1 Drawing Sheet

CHAMBER AND CLEANING PROCESS THEREFOR

BACKGROUND OF THE INVENTION

1. The Field of the Invention

The present invention relates to the etching and deposition of materials on in-process integrated circuit semiconductor substrates, such as silicon wafers. More particularly, the present invention relates to the cleaning of processing chambers within which etching and deposition of materials takes place on in-process integrated circuit wafers.

2. The Relevant Technology

The competitive computer and electronics industry is constantly striving to produce more powerful products at lower prices. One area within this industry which is rapidly progressing is the development of very large scale (VLSI) and ultra large scale (ULSI) integrated circuits. These integrated circuits are being made in increasingly smaller and more integrated scales, and the processes by which they are manufactured are developing to keep up with the pace. These processes, which are continually evolving in the attempt to miniaturize integrated circuits and lower production costs, include etching and deposition operations on in-process integrated circuit wafers or semiconductor substrates from which the integrated circuits are derived.

In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above.

Specifically, one problem which slows down integrated circuit development processes is the removal of deposited material that forms on exposed surfaces of processing chambers during etching and deposition operations on the in-process integrated circuit wafers. In processes such as reactive ion etching (RIE), magnetically enhanced reactive ion etching (MRIE), ion bombardment etching, chemical vapor deposition (CVD), and physical vapor deposition (PVD), the processing chambers in which these operations are conducted unavoidably incur depositions of the etched or deposited materials. The deposited material typically comprises, for example, metals such as aluminum or tungsten, polymer materials from photoresist masking materials, or other materials that are etched from or deposited on the in-process integrated circuit wafers. If not removed, the deposited material will scale, eventually peel off, and fall on the in-process integrated circuit wafers, damaging them.

Newer methods of deposition are now being developed which are more selective and confine the deposits to smaller areas. One example of such a process is a low temperature cold wall CVD process. Nevertheless, even these more selective processes require periodic halts in production to clean buildups of material from the vicinity of the wafer and the equipment on which the wafer is held.

The process conventionally used for removing buildups of material from processing chamber walls is reactive plasma cleaning. In reactive plasma cleaning processes, a plasma is struck in the processing chamber by creating an electrical bias and passing a species source gas such as chlorine, for example, into the electrical bias. The source gas is ionized by collisions with electrons, a plasma is struck thereby, and the ions are accelerated with the electrical bias and strike the exposed surfaces in the processing chamber.

A problem associated with reactive plasma cleaning is that the plasma is indiscriminate and etches all exposed surfaces in the processing chamber, including the processing chamber walls. Many of these surfaces do not incur depositions of material, and their lifetime is prematurely reduced by the plasma cleaning which etches into the surfaces.

Furthermore, the selection of materials from which the processing chamber walls can be made is limited. For instance, if aluminum is being etched or deposited in the processing chamber, a build up of aluminum will occur which must be cleaned, and an etchant for aluminum is typically selected. If the processing chamber walls were constructed of aluminum, however, the cleaning process would rapidly etch into the aluminum walls and eventually cause harm to the processing chamber walls. Consequently, the prior art is limited in the choice of materials for constructing processing chamber walls that can be utilized. Furthermore, even if none of the materials which are deposited and cleaned are the same as the material used for constructing the processing chamber walls, premature wear on the processing chamber walls still typically occurs.

From the above discussion, it can be seen that a new process for cleaning processing chambers is needed in order to increase the throughput of VLSI and ULSI integrated circuit manufacturing where chambers for etching and deposition processes are used. A process is also needed which overcomes the prior art problems of scaling, excessive wear, and inherent limitations in the material of which the processing chamber walls can be formed.

SUMMARY OF THE INVENTION

The present invention seeks to resolve the above and other problems which have been experienced in the art. More particularly, the present invention constitutes an advancement in the art by providing processes for cleaning processing chambers. In accordance with the invention as embodied and broadly described herein in the preferred embodiment, a process is provided for the cleaning of a processing chamber. Also provided is a modified processing chamber in which selected surfaces thereof can be cleaned so as to realize an improved throughput of wafers for the processing chamber.

The modifications to the processing chamber which enable the selective cleaning involve a device for bombarding surfaces with a bombarding species within the enclosed processing chamber, and a device for applying a temperature pattern to a predetermined portion of the bombarded surfaces within the processing chamber. The device for bombarding causes the removal of the built up material deposited on the predetermined portion of the bombarded surfaces, where the built up material is a result of prior operations conducted within the processing chamber. The device for bombarding typically comprises heat driven plasma cleaning, by which species, such as ions, are bombarded upon the inside surface to selectively etch the surfaces which have been heated by the temperature pattern. The species bombardment can be conducted with active or neutral gas species, such as an ion source gas. Alternatively, a reactive species can be created remote from the chamber and then transported into the chamber. The reactive species, once within the chamber, begins to bombard inside surfaces of the chamber that have been heated in a predetermined temperature pattern.

The device for applying a temperature pattern can be of any construction such that energy is applied to exposed surfaces in a predetermined temperature pattern. Three general embodiments are disclosed herein. In various embodiments, the temperature pattern is applied with the use of flame emitting nozzles, or with the use of lamps which are directed to the selected surfaces which have received deposits of material. Multiple lamps can be used, and the lamps can be of different intensities and can be set at different power levels in order to better customize the temperature pattern.

In a further general embodiment, heating elements are embedded in the predetermined portion of the bombarded surfaces which receive greater deposits of material. The heating elements can be arranged in particular patterns and can also be varied in heat output and power levels in order to better select the surfaces which have received greater deposits of material.

A third general embodiment comprises the use of a susceptor located at or near the predetermined portion of the bombarded surfaces which have received deposits of the material. The susceptor can also be customized in its shape and in the pattern of the heat applied to the susceptor. The susceptor is typically constructed of a heat conducting material such that it radiates heat in a predetermined pattern to those surfaces which have received deposits of the material from the prior operations.

The process of the present invention comprises first providing the modified processing chamber. Next, a temperature pattern is applied within the processing chamber. In one embodiment the temperature pattern is applied by heating the surfaces which have received deposits of material. The next step comprises creating an electrical voltage bias within the processing chamber. In a further step, a reactive species gas is flowed into the processing chamber. The reactive species gas, can be created inside or outside of the processing chamber. A plasma is thereby struck, and the reactive species are directed to bombard the exposed surfaces which have received deposits of material, so as to initiate the heat driven plasma cleaning process, thereby selectively cleaning and removing the deposited material from the bombarded heated surfaces. The surfaces which are not heated are not bombarded.

BRIEF DESCRIPTION OF THE DRAWINGS

In order that the manner in which the above-recited and other advantages and of the invention are obtained will be understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

A preferred embodiment of the present invention comprises a processing chamber through which species bombardment cleaning is focused on only those surfaces within the processing chamber which receive built up deposits of material during processing within the chamber. Portions of the processing chamber such as the processing chamber walls which do not incur deposits are not bombarded. The species bombardment cleaning enables the processing chamber to maintain a high throughput of wafers being processed within the chamber, and enables the preservation of portions of the processing chamber which do not receive deposits, such that they will sustain longer serviceable lifetimes.

The processing chamber of the present invention comprises a device for applying a temperature pattern to a predetermined portion of the exposed surfaces of the processing chamber which receive greater amounts of deposited materials. The processing chamber of the present invention also includes a device for supplying a species for the bombarding of the predetermined portion of the exposed surfaces. The bombarding species is used with a heat driven plasma cleaning process which is preferentially bombards the heated areas. The heat driven plasma cleaning process preferentially bombards the heated surfaces because of the enhanced reaction rate of the bombarding species with the surfaces of the processing chamber having the highest temperatures. Bombarding ions are an example of the contemplated bombarding species.

Figure 1:
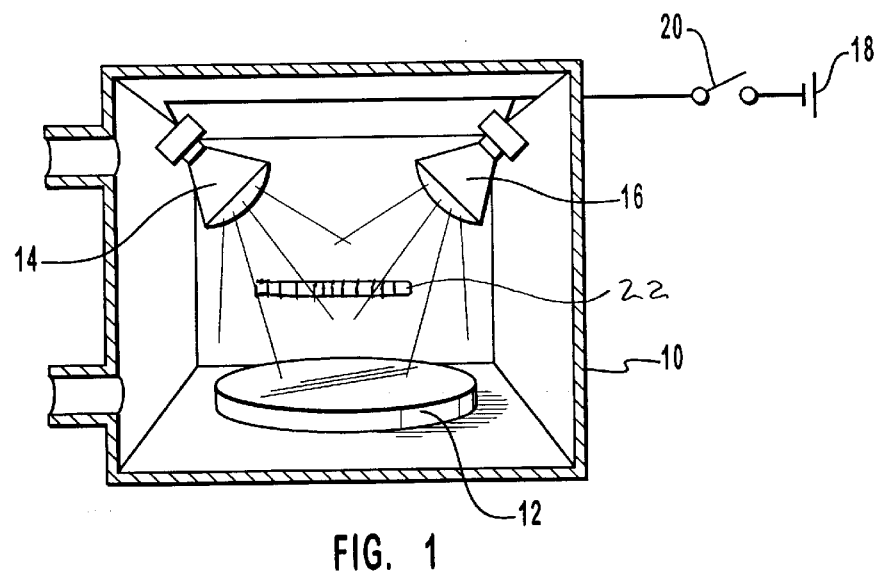
FIG. 1 is a schematic representation of a processing chamber which has been modified in accordance with a first general embodiment of the present invention, where structures are positioned within the chamber for the purpose of localized heating of inside surfaces of the chamber, where the structures alternatively heat by the production therefrom of combustion flames, or by the production therefrom of heat energy from heating lamps, where the localized heating of inside surfaces of the chamber is directed to heat surfaces of the processing chamber which receive deposits of built up materials during processing.

Several general embodiments are presently contemplated for applying a temperature pattern to the predetermined portion of exposed surfaces of the processing chamber which incur deposits. As seen in a FIG. 1, a processing chamber 10 is depicted. Processing chamber 10 can be of any type which incurs deposits of material, and in which species bombardment can be conducted. It is contemplated that the processing chamber of the present invention can be similar to and suitable for performing the same processes as conventional processing chambers, including those for reactive ion etching (RIE), magnetically enhanced reactive ion etching (MRIE), physical vapor deposition (PVD), and chemical vapor deposition (CVD).

Processing chamber 10 normally contains some form of a wafer holder 12 which, during processing, holds the in-process integrated circuit wafer or semiconductor substrate in a desired position. Processing chamber 10 will typically also contain other exposed surfaces on which deposits form, such as a collimator 22, used for controlling step coverage in PVD chambers. The exposed surfaces may also comprise a ring located around wafer holder 12 which is used for controlling gas flow dynamics and which, due to its proximity to wafer holder 12, also sustains large deposits.

In one embodiment, structures 14 and 16 are employed within a processing chamber 10 for the purpose of directing combustion flames emitted therefrom to specific locations on interior surfaces of processing chamber 10 where a build up of material occurs. Flames emitted from structures 14 and 16 are conventionally formed such as by the combustion of a flammable mixture of a gas, and structures 14 and 16 are contemplated to be adjustable so as to direct the flames to various locations within processing chamber 10.

In another embodiment, there is a focusing of optical energy on the portions of the processing chamber which are to be cleaned. In this embodiment, structures 14 and 16 are contemplated to be a first lamp 14 and a second lamp 16, respectively. Either a single lamp or multiple lamps can be used. First and second lamps 14 and 16 are connected to a power source 18 with a switch 20. First and second lamps 14 and 16 are focused on the areas of processing chamber 10 which incur heavier material deposits. A greater number of lamps could be used to create a more selective and intricate temperature pattern. Also, lamps 14 and 16 could be positioned at varying distances from the surfaces being cleaned or could be operated at different power levels or intensities to customize the temperature pattern and thereby select the amounts of cleaning that will take place on the various surfaces of processing chamber 10. For instance, wafer holder 12 and the immediate area around it typically will incur the most buildup, and consequently, more energy must be focused thereon. Thus, lamps 14 and 16 are focused on wafer holder 12, as shown.

When depositing through a collimator 22, collimator 22 will also sustain high amounts of buildup. Thus, lamps 14 and 16 will also be focused on the collimator or the other such surfaces when necessary, and their energies adjusted to correspond to the amount of deposits normally occurring on the particular surfaces during the scheduled amount of processing between cleans of chamber 10, with greater amounts of heat being directed to the surfaces which incur greater amounts of deposition. Thus, a temperature pattern can be rapidly applied which heats in gradients, such that surfaces with varying degrees of deposits are heated to varying degrees.

Figure 2:
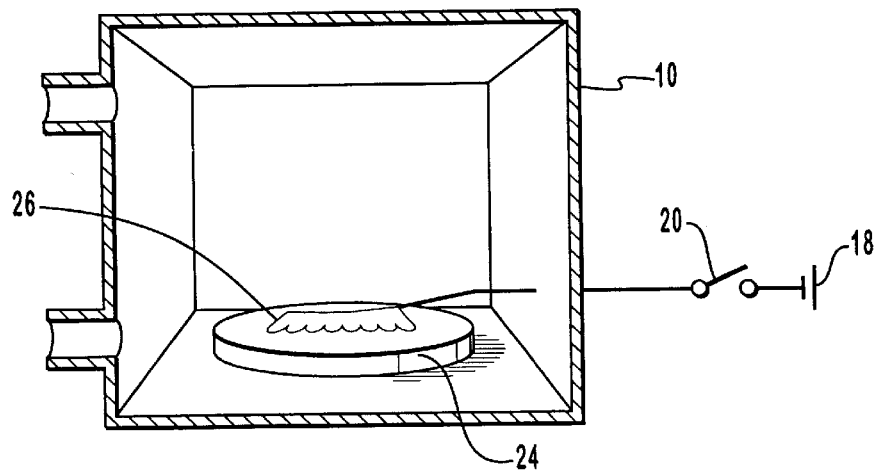
FIG. 2 is a schematic representation of a processing chamber which has been modified in accordance with a second general embodiment of the present invention involving the use of a heating element to heat surfaces of the processing chamber which receive large deposits of built up materials during processing.

Another embodiment contemplated in connection with the present invention comprises resistive heating. In one embodiment, shown by way of example in FIG. 2, resistive heating is achieved by implanting heating coils in the areas which incur greater deposits of material. Shown in FIG. 2 is a processing chamber 10 provided with a wafer holder 24 similar to wafer holder 12 of FIG. 1. In accordance with the second embodiment of the present invention, however, a heating element 26 is embedded in wafer holder 24. Heating element 26 is connected to power source 18 by switch 20. Multiple heating elements can be used, as with the multiple lamps 14 and 16, and can also be arranged to provide greater or lesser amounts of heat, corresponding to the respective build up of material on the various surfaces of processing chamber 10 of FIG. 2. Power levels for each of the multiple heating elements can also be adjusted to create the varying temperature pattern as necessary.

Figure 3:
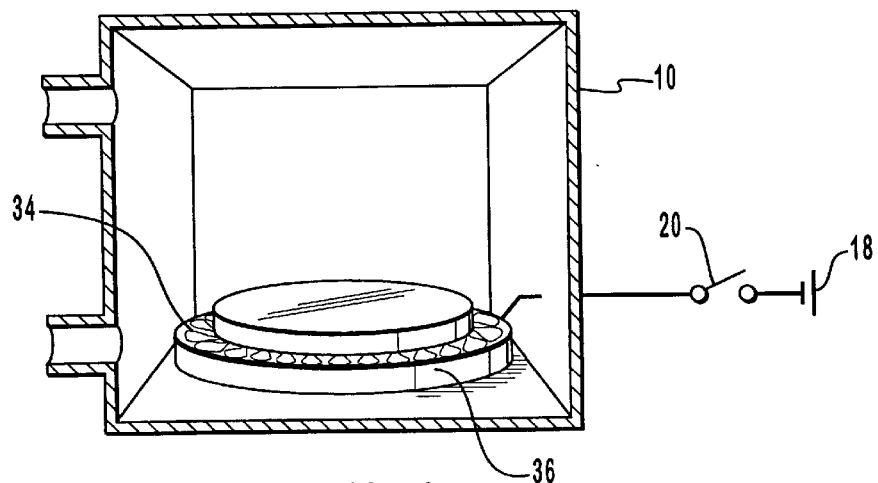
FIG. 3 is a schematic representation of a processing chamber which has been modified in accordance with a third general embodiment of the present invention comprising the use of a heated susceptor to radiate heat to surfaces of the processing chamber which receive large deposits of built up materials during processing.

In a still further general embodiment, a susceptor is used to radiate heat to the areas of higher depositions. This is shown in one exemplary embodiment in FIG. 3. Therein is shown a processing chamber 10 provided with a wafer holder 36. In accordance with the third embodiment of the present invention, processing chamber 10 is also provided with a susceptor 34. Susceptor 34 is located proximal to wafer holder 36, and can also be located close to other areas where depositions occur. Susceptor 34 is preferably constructed of a heat conducting material such as iron or steel. A device for applying heat to susceptor 34 is used for heating susceptor 34 to a high temperature. In the embodiment depicted in FIG. 3, susceptor 34 is heated with a heating element connected with a power source 18 through switch 20. The heating of susceptor 34 causes it to radiate heat so as to heat its environs. Thus, by preferential locating susceptor 34, and by forming it in appropriate shapes and selectively heating it if necessary, the areas of processing chamber 10 which incur greater deposition can be radiated with heat and thereby be selectively cleaned with the above-described cleaning process which is preferential to heat.

A process for cleaning a processing chamber is also part of the present invention. This process comprises first providing a modified processing chamber within which a temperature pattern can be applied to selected surfaces within the processing chamber which incur deposits of a material as a result of prior operations conducted within the processing chamber. The processing chamber can utilize one of the foregoing embodiments described above to provide the capability of applying a heating pattern, or can be constructed to incorporate any other device for applying a temperature pattern to selected exposed surfaces, as described above. The temperature pattern is then selectively applied to portions of the interior of the processing chamber and includes within the temperature pattern a predetermined portion of the exposed surfaces of the processing chamber which receive deposits of material from the prior operations.

Next, an electrical bias is applied in the processing chamber within the processing chamber. Where it is desired that ions bombard a build up of material within processing chamber 10, an ion source gas is flowed into the processing chamber to act as a source of ion bombardment within the processing chamber. The selected surfaces within the processing chamber which are included within the temperature pattern are then bombarded with ions.

Alternatively, reactive species can be created remote from processing chamber 10. The reactive species thus created are then transported into processing chamber 10 to initiate the bombardment of material build up within processing chamber 10.

Cleaning can be performed by a various gas species. Examples of such gas species are $ClF_3$, HCl, $Cl_2$, $F_2$, and $NF_3$. The choice of a neutral gas species is dependent upon the material built up on interior surfaces of the chamber that is to be removed.

Flowing the gas into the processing chamber and bombarding with species the selectively heated surfaces will effectively remove the material deposited on the selectively heated surfaces as a result of previous processes, but will not clean portions of the processing chamber which, because they have not incurred deposits of material, are not heated. This preserves the processing chamber walls and allows the option to construct the processing chamber walls of any suitable material, including the material which is being cleaned from the heated surfaces. Consequently, chamber walls made of a material such as, for instance, aluminum, can be used while still enabling the deposition or etching and consequent cleaning of aluminum from surfaces within the processing chamber. Also, because heat driven plasma cleaning is used rather than manual cleaning, high throughput of etching or deposition operations can be maintained because down time for cleaning the chamber is minimized.

Thus, it can be seen from the above discussion that a modified processing chamber and a process for cleaning a processing chamber are provided through which deposited materials can be selectively removed from exposed surfaces of the processing chamber while preserving the surfaces that do not receive depositions. A faster throughput is enabled by the invention. The modified processing chamber and cleaning process also allow for in-situ cleaning. Greater flexibility is provided in the choice of processing chamber wall materials from which the chamber walls can be made is provided, as well as the materials which are to be cleaned therefrom. As such, the same materials can be used in constructing the chamber walls as are cleaned from the interior of the processing chamber.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A material removal process comprising:
   providing a chamber having a material upon a portion of an exposed interior surface of the chamber;
   selectively increasing the temperature of the material upon the portion of the exposed interior surface of the chamber;
   removing the material that is upon the portion of the exposed interior surface of the chamber with a reactive species.

2. The process as defined in claim 1, wherein removing the material that is upon the portion of the exposed interior surface of the chamber with said reactive species comprises bombarding said material with said reactive species.

3. The process as defined in claim 2, wherein increasing the temperature of the material upon the portion of the exposed interior surface of the chamber comprises maintaining without a substantial increase in temperature at least one other portion of the exposed interior surface of the chamber, and wherein said reactive species does not substantially bombard said at least one other portion of the exposed interior surface of the chamber.

4. The process as defined in claim 2, wherein bombarding said material with said reactive species comprises bombarding said material with ions.

5. A process as recited in claim 1, wherein increasing the temperature of the material comprises directing heat from at a lamp to at least a portion of the material.

6. A process as recited in claim 1, wherein increasing the temperature of the material comprises resistive heating the portion of the exposed interior surface of the chamber.

7. A process as recited in claim 1, wherein increasing the temperature of the material comprises heating a conductive susceptor to heat the material.

8. A process as recited in claim 1, wherein increasing the temperature of the material comprises directing combustion flames to at least a portion of the material.

9. A process as recited in claim 1, wherein the reactive species is selective from a group consisting of $ClF_3$, HCl, $Cl_2$, $F_2$, and $NF_3$.

10. A process for cleaning a chamber comprising:
    providing a chamber having therein:
       an interior surface, a portion thereof having a material thereon; and
       a reactive species;
    increasing the temperature of the material upon the portion of the interior surface of the chamber;
    bombarding the material with the reactive species within the chamber to remove the material that is upon the portion of the interior surface of the chamber.

11. A process for cleaning a chamber comprising:
    providing a chamber having therein:
       an interior surface, a first portion thereof having a material thereon,
       and a second portion thereof not having said material thereon; and
       a reactive species;
    substantially increasing the temperature of a first portion of the material upon the first portion of the interior surface of the chamber, while not substantially increasing the temperature of a second portion of the material upon the first portion of the interior surface of the chamber;
    bombarding the first portion of the material with the reactive species within the chamber to remove said first portion of the material that is upon the first portion of the interior surface of the chamber, wherein the reactive species does not substantially bombard either the second portion of the interior surface or the second portion of the material upon the first portion of the interior surface of the chamber.

12. A process for cleaning a chamber comprising:
    providing a chamber having an exposed interior surface therein upon which is deposited a material, and having an unexposed interior surface therein not having deposited thereon the material;
    increasing the temperature of the exposed interior surface by applying thereto a temperature pattern, while substantially maintaining as unchanged the temperature of the unexposed interior surface of the processing chamber;
    creating a reactive species in the chamber; and
    substantially bombarding with the reactive species the material deposited on said exposed interior surface to remove therefrom the material, said reactive species not substantially bombarding the unexposed interior surface of the processing chamber.

13. The process as defined in claim 12, wherein creating said reactive species in the chamber comprises:
    creating an electrical voltage bias within the processing chamber; and
    flowing an ion source gas into the processing chamber to create a plasma, and wherein substantially bombarding with the reactive species the material deposited on said exposed interior surface comprises:
       substantially bombarding with ions in said plasma the material deposited on said exposed interior surface to remove therefrom the material, said ions in said plasma not substantially bombarding the unexposed interior surface of the processing chamber.

14. A process as recited in claim 12, wherein increasing the temperature of the exposed interior surface by applying thereto said temperature pattern comprises directing combustion flames to the exposed interior surface of the processing chamber.

15. A process as recited in claim 12, wherein increasing the temperature of the exposed interior surface by applying thereto said temperature pattern comprises directing heat from at least one lamp to the exposed interior surface of the processing chamber.

16. A process as recited in claim 12, wherein increasing the temperature of the exposed interior surface by applying thereto said temperature pattern comprises resistive heating at least one heating element embedded in the exposed interior surface of the processing chamber.

17. A process as recited in claim 12, wherein increasing the temperature of the exposed interior surface by applying thereto a temperature pattern comprises heating a conductive susceptor located proximate to the exposed interior surface of the processing chamber, such that the susceptor radiates heat to the exposed interior surface of the processing chamber.

18. A process as recited in claim 12, wherein the exposed interior surface of the processing chamber is at least one of a wafer holder and a collimator.

19. A process as recited in claim 12, wherein the processing chamber comprises a PVD chamber.

20. A process as recited in claim 12, wherein the processing chamber comprises a CVD chamber.

21. A process as recited in claim 12, wherein the exposed interior surface of the processing chamber is upon an interior wall of the processing chamber and wherein the interior wall of the processing chamber is composed of a material which is substantially the same as the material deposited on said exposed interior surface of said processing chamber.

22. A process as recited in claim 21, wherein the interior wall of the processing chamber is composed of aluminum.

23. A process as recited in claim 12, wherein the ion source gas is composed of a neutral gas species.

24. A process as recited in claim 23, wherein the neutral gas species comprises $ClF_3$.

25. A process as recited in claim 12, wherein the ion source gas is an active gas species.

26. A process as recited in claim 25, wherein the active gas species comprises $Cl_2$.

27. A process cleaning for a processing chamber for semiconductor wafer comprising:

providing a processing chamber for processing semiconductor wafers, said processing chamber having an exposed interior surface therein upon which is deposited a material, and having an unexposed interior surface therein not having deposited thereon the material, and wherein the exposed interior surface of the processing chamber comprises a wafer holder, a collimator, and an interior wall of the processing chamber that is composed of a material which is substantially the same as the material deposited on said exposed interior surface of said processing chamber;

increasing the temperature of the exposed interior surface by applying thereto a temperature pattern, while substantially maintaining as unchanged the temperature of the unexposed interior surface of the processing chamber;

creating an electrical voltage bias within the processing chamber; and flowing an ion source gas into the processing chamber to create a plasma with ions in said plasma substantially bombarding the material deposited on said exposed interior surface to remove therefrom the material, said ions in said plasma not substantially bombarding the unexposed interior surface of the processing chamber.

28. A process as recited in claim 27, wherein the processing chamber comprises a PVD chamber.

29. A process as recited in claim 27, wherein the processing chamber comprises a CVD chamber.

30. A chamber comprising:

an exposed interior surface;

a device for substantially increasing the temperature of a portion of the exposed interior surface, while not substantially increasing the temperature of at least one other portion of the exposed interior surface;

a device for introducing a reactive species to remove a material that is upon the portion of the exposed interior surface of the chamber.

31. The chamber as defined in claim 30, wherein the exposed interior surface is within a PVD chamber.

32. The chamber as defined in claim 30, wherein the exposed interior surface is within a CVD chamber.

33. A processing chamber comprising:

an interior surface having an exposed portion for receiving a deposited material, said interior surface having an unexposed portion that is not to receive a deposit of said material;

a device for increasing the temperature of the exposed portion by applying thereto a temperature pattern, while substantially maintaining as unchanged the temperature of the unexposed portion;

a device for creating an electrical voltage bias within the chamber; and a device for flowing an ion source gas into the processing chamber and for creating a plasma such that ions in said plasma substantially bombarding the material deposited on said exposed portion so as to remove therefrom the material, said ions in said plasma not substantially bombarding the unexposed interior surface of the processing chamber.

34. A processing chamber as recited in claim 33, wherein the device for increasing the temperature of the exposed interior surface by applying thereto a temperature pattern comprises a heat lamp for directing heat from at least one lamp to the exposed interior surface of the processing chamber.

35. A processing chamber as recited in claim 33, wherein the device for increasing the temperature of the exposed interior surface by applying thereto a temperature pattern comprises a resistive heating apparatus having at least one heating element embedded in the exposed interior surface of the processing chamber.

36. A processing chamber as recited in claim 33, wherein the device for increasing the temperature of the exposed interior surface by applying thereto a temperature pattern comprises a conductive susceptor located proximate to the exposed interior surface of the processing chamber, such that the susceptor radiates heat to the exposed interior surface of the processing chamber.

37. A processing chamber as recited in claim 33, wherein the exposed interior surface of the processing chamber comprises a wafer holder and a collimator.

38. A processing chamber as recited in claim 33, wherein the processing chamber comprises a PVD chamber.

39. A processing chamber as recited in claim 33, wherein the processing chamber comprises a CVD chamber.

40. A processing chamber as recited in claim 33, wherein the exposed interior surface of the processing chamber comprises an interior wall of the processing chamber and wherein the interior wall of the processing chamber is composed of a material which is substantially the same as the material deposited on said exposed interior surface of said processing chamber.

41. A processing chamber as recited in claim 40, wherein the interior wall of the processing chamber is composed of aluminum.

42. A chamber comprising:

an interior surface having an exposed portion for receiving a deposited material, said interior surface having an unexposed portion that is not to receive a deposit of said material;

a device for increasing the temperature of the deposited material, while substantially maintaining as unchanged the temperature of the unexposed portion;

a device for creating an electrical voltage bias within the chamber; and a device for flowing an ion source gas into the chamber and for creating a plasma such that, after said ion source gas is flowed into the chamber, the ions in said plasma substantially bombarding the material deposited on said exposed portion as to remove therefrom the material, said ions in said plasma not substantially bombarding the unexposed interior portion.

43. A self cleaning processing chamber for semiconductor wafers comprising:

an exposed interior surface upon which is deposited a material, and having an unexposed interior surface not having deposited thereon the material;

apparatus for increasing the temperature of the exposed interior surface by applying thereto a temperature pattern, while substantially maintaining as unchanged the temperature of the unexposed interior surface of the processing chamber;

apparatus for creating an electrical voltage bias within the processing chamber; and apparatus for flowing an ion source gas into the processing chamber to create a plasma with ions in said plasma substantially bombarding the material deposited on said exposed interior surface to remove therefrom the material, said ions in said plasma not substantially bombarding the unexposed interior surface of the processing chamber.

* * * * *

UNITED STATES PATENT AND TRADEMARK OFFICE
CERTIFICATE OF CORRECTION

PATENT NO. : 6,201,219 B1
DATED : March 13, 2001
INVENTOR(S) : Gurtej S. Sandhu, Ravi T. Iyer and Donald L. Westmoreland It is certified that error appears in the above-identified patent and that said Letters Patent is hereby corrected as shown below:

Column 3,
Line 36, after "gas" delete ","
Line 47, after "advantages" delete "and"

Column 4,
Line 38, after "which" delete "is"

Column 6,
Line 7, change "preferential" to -- preferentially --

Column 7,
Line 47, after "from" delete "at"

Column 10,
Line 23, change "bombarding" to -- bombard --

Column 11,
Line 7, change "bombarding" to -- bombard --

Signed and Sealed this

Sixteenth Day of April, 2002

Attest:

Attesting Officer

JAMES E. ROGAN
Director of the United States Patent and Trademark Office